Figure 1:
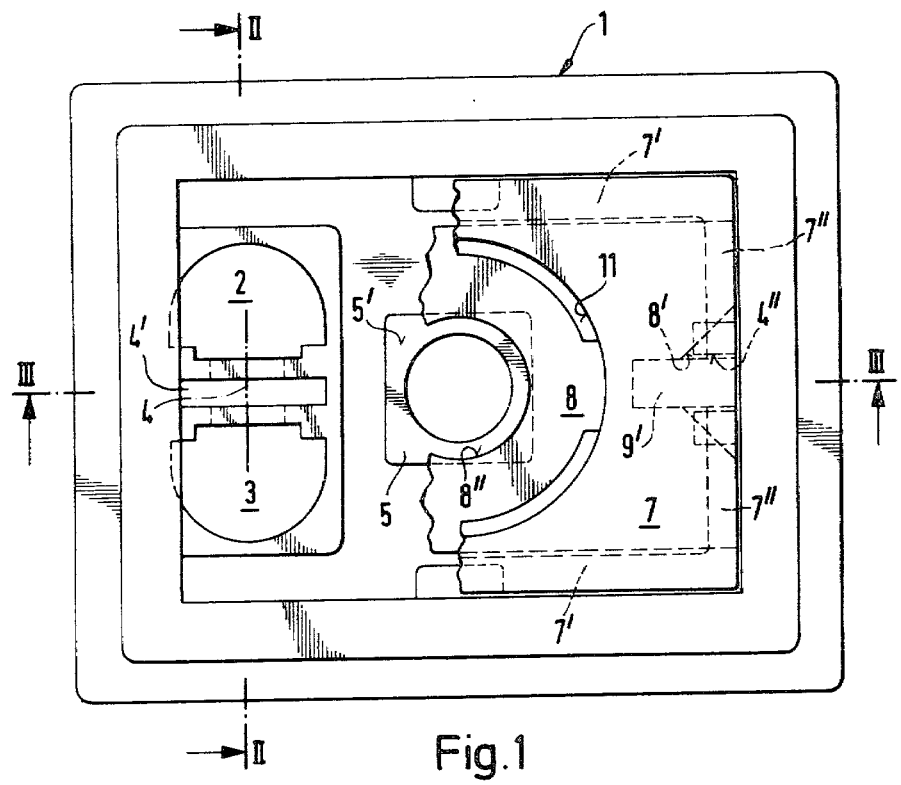

United States Patent [19]

Speidel et al.

[11] 4,251,723
[45] Feb. 17, 1981

[54] OPTO-ELECTRONICAL SWITCHING DEVICE, SPECIALLY FOR MOTOR VEHICLES

[75] Inventors: Volker Speidel, Schalksmühle; Eduard Bergmann, Lüdenscheid-Dünnebrett; Lothar Worlitz, Altena, all of Fed. Rep. of Germany

[73] Assignee: Firma Leopold Kostal, Lüdenscheid, Fed. Rep. of Germany

[21] Appl. No.: 1,923

[22] Filed: Jan. 8, 1979

[30] Foreign Application Priority Data

Nov. 6, 1978 [DE] Fed. Rep. of Germany ....... 2848103

[51] Int. Cl.³ .............................................. H01J 39/12
[52] U.S. Cl. .................................... 250/229; 200/340
[58] Field of Search .................... 250/229; 340/365 P, 340/365 R; 200/67 DB, 340

[56] References Cited

U.S. PATENT DOCUMENTS 3,906,222   9/1975   Astier et al. ..................... 250/229

*Primary Examiner*—David C. Nelms
*Assistant Examiner*—Darwin R. Hostetter
*Attorney, Agent, or Firm*—Bacon & Thomas

[57] ABSTRACT

An opto-electronical switching device provided with an operating push-button key, particularly for motor vehicles, comprises a housing, containing a photodiode and a phototransistor, a rectangular push-button key, guided in the housing, with aperture plate and with an after-connected interrogating circuit, responding to the switching condition of the phototransistor. A rectangular leaf spring, curved transversely to the longitudinal direction, supported with its corners upon ribs of the push-button key inner surface and curved away from the push-button key inner surface, and the counter-support of the leaf spring is formed by a pin in the geometrical mid-point.

6 Claims, 5 Drawing Figures

OPTO-ELECTRONICAL SWITCHING DEVICE, SPECIALLY FOR MOTOR VEHICLES The invention relates to an opto-electronic switching device provided with an operating key, particularly for motor vehicles, having a housing, comprising a photodiode and a phototransistor, having a rectangular push-button key, guided in the housing, with aperture plate and with an after-connected interrogating circuit, responding to the switching condition of the phototransistor.

Opto-electronic switching devices are characterized by a small switching distance, high switching security, and low wear.

It is the object of the invention to utilize such characteristics for a switching device for motor vehicles.

According to the invention this object is solved in that a rectangular leaf spring, curved transversely to the longitudinal direction, is supported with its corners upon ribs of the push-button key inner surface and is curved away from the push-button key inner surface, and that the counter-support of the leaf spring is formed by a pivot pin in the geometrical mid-point.

The invention utilizes the comparatively small switching distance of an opto-electronic switching device which operates with a movement of, e.g., 1 mm. The working point of the readjusting spring makes itself noticeable when operating the push-button key so that the operating person has a safe switching feeling. The leaf acts as a catch spring or an elastic spring so that the switching point is noticeable also acoustically.

A further development of the invention provides that the photodiode and the interrogating circuit are connected with a pulse generator which, on the one hand, gives drive pulses to the photodiode and, on the other hand, gives interrogating pulses to the interrogating circuit.

By this development the instantaneous photocurrent can possess a substantially higher value as compared with a constant current so that thereby a high signal-to-background ratio of the arrangement is achieved. Due to the fact that the photocurrent merely flows during the comparatively short pulse time, an interference with the photodiode in regard to the durability is removed.

The interrogating circuit is provided as bistable flip-flop stage, the clock input of which being connected with the line, carrying interrogating pulses, and the dynamic information input of which being connected, according to the kind of circuit, with the collector or the emitter of the phototransistor, and, in addition, the bistable flipflop stage comprises one output or two complementary outputs. Thereby the specific switching condition of the push-button key can be safely detected during the interrogating pulse. The output signals of the flipflop stage enable a further processing.

Figures 4, 5:
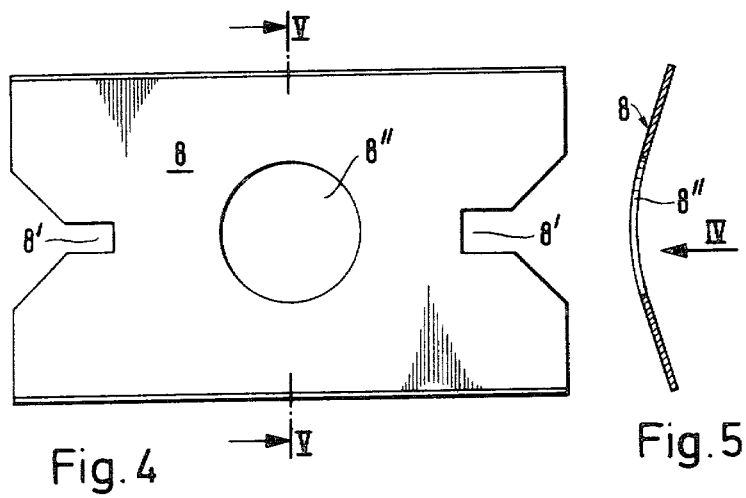
Figure 2:
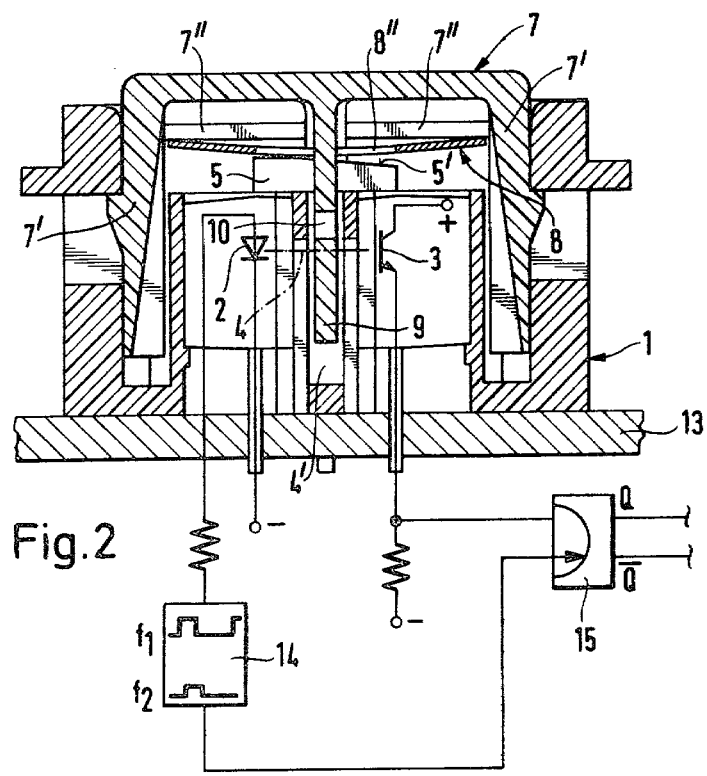
Figure 3:
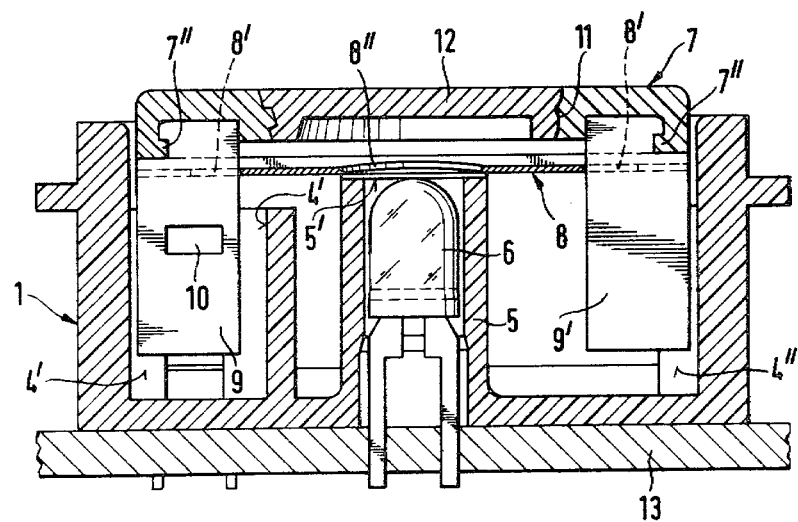

One embodiment of the invention will be described in the following with reference to the attached drawings, wherein FIG. 1 shows a plan view of a switching device according to the invention, with portions of the push-button key and leaf spring broken away, FIG. 2 is a sectional view taken on line II—II in FIG. 1, FIG. 3 is a sectional view taken on line III—III in FIG. 1, FIG. 4 is a plan view of the leaf spring, and FIG. 5 shows a sectional view taken on line V—V in FIG. 4.

A switch housing 1 defines chambers opposite to each other, in one of which is a photodiode 2 and, in the other, a phototransistor 3 which are spectrally tuned to each other. The lightemitting crystal face of the photodiode 2 and the optically absorptive crystal face of the phototransistor 3 are oriented on an optical axis 4. In addition, the switch housing 1 has a hollow pin 5, thus forming a chamber for the reception of a luminous diode 6. The front face 5' of pin 5 is sloped towards a long side of the switch housing 1, see FIG. 2. Furthermore, there are provided, on the transverse sides of the switch housing 1, slots 4' and 4" which serve for the guiding of a push-button key 7.

The push-button key 7 fits into the rectangular cutout of the switch housing and comprises, at the longitudinal walls, guide walls 7' as well as, at the transverse walls, ribs 7". An aperture plate 9, molded or provided on the inner side of the push-button key, extends, for the guidance, into the slot 4', a guide plate 9' extends into the slot 4". The aperture plate 9 comprises a window 10 which, when push-button key 7 is pushed, uncovers the optical axis 4.

A rectangular snap-acting leaf spring 8 is curved transversely to its longitudinal dimension and is supported with the corner regions upon the ribs 7". The leaf spring 8 contains cuts 8' for guidance on the aperture plate 9 and the guide plate 9' and, furthermore, a central opening 8" which fits on the pin 5. In the basic condition the leaf spring 8 is curved-out from the inner surface of the push-button key 7, cf. FIG. 1. The leaf spring 8 is supported on the front 5' of pin 5 so that owing to the slope of the front 5' towards a long side of the switch housing and, thus, transversely to the axis of curvature of the leaf spring 8 there is provide a one-side support for the leaf spring. When operating the push-button key the leaf spring 8 results in a straining point which, according to hardness or strength of material, respectively, of the spring, may be between 0.5 N and 10 N. When pressing the push-button key the exceeding of the straining point is acoustically audible. This acoustical distinguishability is increased in that the supporting of the leaf spring is performed excentrically due to the slope of the pin 5 so that an increased straining of the spring is achieved which manifests itself in a snap action having a clear crackling sound.

The push-button key 7 in its top surface a cut 11; a symbol plate 12 may be inserted into such cut which symbol plate bears switching symbols for different functions of the switching device and which is illuminated by the luminous diode 6.

The switch housing 1 is mounted on an electrical conductor plate 13 and fastened. The electrical connections are soldered to corresponding conductors. The photodiode 2 is connected to an output of an interrogating pulse generator 14. A further output of this interrogating pulse generator 14 is connected to the cycle input of an interrogating circuit 15. The phototransistor 3 is connected to the dynamical information input of the interrogating circuit 15. The interrogating circuit 15 is provided, e.g., as a bistable flipflop stage. The interrogating circuit 15 comprises two complementary outputs having the signal values Q and Q̄. The interrogating pulse generator 14 generates two impulse sequences $f_1$ and $f_2$. The pulses $f_1$ having a larger pulse width, apply a high instantaneous value of the photocurrent to the photodiode 2. The interrogating pulses $f_2$ which are within the pulses $f_1$ possess a smaller pulse width and control the interrogating circuit 15.

FIG. 1 shows the switch-off condition of the switching device. The optical path between the photodiode 2 and the phototransistor 3 along the optical axis 4 is interrupted by plate 9. The collector-emitter of the phototransistor 3 is highly resistive. After the push-button key 7 has been pressed past the straining point and snapping point of spring 8, the optical axis is uncovered so that the value of resistance of the phototransistor 3 changes to a value of low impedance. In each case during the pulses $f_1$ a current flows through the photodiode 2 so that a signal is delivered. This signal influences in each case the conductivity condition of the phototransistor 3. This conductivity value is interrogated by the interrogating pulses $f_2$ and is at disposal at the outputs of the interrogating circuit 15 in complementary form. The pulsed operation renders possible a very low resting loss output of the photodiode and of the phototransistor. The instantaneous value of the photocurrent may be high, without it being necessary to fear a destruction of the photodiode. In addition, a high signal-to-noise ratio is achieved. The switching device is insensitive to disturbance pulses.

A plurality of switching devices may be connected to a common interrogating pulse generator 14. Thereby one obtains a common and actual interrogation of a plurality of adjacently arranged switching devices for different switching functions.

The information input is connected with the phototransistor. Depending on the kind of the circuit for this there are at the disposal of those skilled in the art different possibilities of connection. Particularly a connection with the collector or the emitter comes into consideration, however, it is also possible to interrogate electrical tensions and/or currents at other positions of the switching arrangement.

What we claim is:

1. An opto-electronic switching device:
   a housing containing a photodiode and a phototransistor;
   a rectangular push button slidable in said housing and having an apertured plate extending between said photodiode and phototransistor and movable between positions where its aperture blocks or opens an optical path between said photodiode and phototransistor;
   a rectangular snap-acting leaf spring curved transversely of its long dimension arranged with its corners engaging corner portions of said push button and being normally concave on the side facing said push button; and
   a fixed pin in said housing having an end engaging said leaf spring, on its side facing away from said push button, near the geometrical center of the spring.

2. A switching device as defined in claim 1 wherein said end of said pin defines a sloping surface sloping in a direction transverse to the curvature of the leaf spring.

3. A switching device as defined in claim 1 wherein said pin is hollow and contains a luminious diode.

4. Switching device according to one of claims 1 through 3, characterized in that the photodiode (2) and an interrogating circuit (15) are connected with a pulse generator (14) which, on the one hand, provides drive pulses for the photodiode (2) and, on the other hand, provides interrogating pulses to the interrogating circuit (15).

5. Switching device according to claim 4, characterized in that the pulse width of the interrogating pulses ($f_2$) is substantially smaller than the pulse width of the drive pulses ($f_1$), and the interrogating pulses are within the width of the drive pulses.

6. Switching device according to claim 4 characterized in that the interrogating circuit (15) is provided as bistable flip-flop stage, having a clock input connected with the line carrying interrogating pulses, and a dynamic information input of which being connected with one of the collector and the emitter of the phototransistor, the bistable flip-flop stage comprising at least one output.

* * * * *